United States Patent
Brooks et al.

(10) Patent No.: US 7,563,564 B2
(45) Date of Patent: Jul. 21, 2009

(54) METHOD OF FORMING FLEXIBLE ELECTRONIC CIRCUITS

(75) Inventors: Andrew S. Brooks, New Road (GB); Sean D. Slater, Meldreth (GB); Peter Hewitson, Uxbridge (GB)

(73) Assignee: Eastman Kodak Company, Rochester, NY (US)

( * ) Notice: Subject to any disclaimer, the term of this patent is extended or adjusted under 35 U.S.C. 154(b) by 16 days.

(21) Appl. No.: 11/911,234

(22) PCT Filed: Mar. 24, 2006

(86) PCT No.: PCT/GB2006/001099

§ 371 (c)(1),
(2), (4) Date: Oct. 11, 2007

(87) PCT Pub. No.: WO2006/111698

PCT Pub. Date: Oct. 26, 2006

(65) Prior Publication Data

US 2008/0206689 A1 Aug. 28, 2008

(30) Foreign Application Priority Data

Apr. 22, 2005 (GB) .................................. 0508186.4

(51) Int. Cl.
*G03C 5/18* (2006.01)
*G03C 5/26* (2006.01)
*G03C 1/08* (2006.01)

(52) U.S. Cl. ...................................... 430/401; 430/508

(58) Field of Classification Search ................. 430/401, 430/508
See application file for complete search history.

(56) References Cited

U.S. PATENT DOCUMENTS

| 2,854,386 | A | 9/1958 | Lyman et al. |
| 3,424,581 | A | 1/1969 | Nawn et al. |
| 3,647,456 | A | 3/1972 | Herd et al. |
| 3,929,483 | A | 12/1975 | Wainer et al. |
| 4,753,821 | A | 6/1988 | Giesecke et al. |
| 5,384,230 | A | 1/1995 | Berg |
| 2008/0199665 | A1* | 8/2008 | Slater et al. ................. 428/209 |

FOREIGN PATENT DOCUMENTS

| DE | 1 938 373 | 2/1971 |
| GB | 1092607 | 11/1967 |
| JP | 3-171043 | 7/1991 |

OTHER PUBLICATIONS

JP Abstract 03-171043 (Jul. 24, 1991).

* cited by examiner

*Primary Examiner*—Geraldina Visconti

(57) ABSTRACT

A multiple layer photosensitive silver halide element having at least one sensitized photosensitive layer on each side of a support, such as a transparent flexible support, is imagewise exposed according to a desired circuit pattern and developed to form a layer of conductive track patterns from each photosensitive layer. The resulting multiple layer conductive element has application in the field of printed circuit board manufacture or as the backplane electronic element of a flexible display device.

10 Claims, No Drawings

METHOD OF FORMING FLEXIBLE ELECTRONIC CIRCUITS

FIELD OF THE INVENTION

The present invention relates to formation of conductive materials as conductive tracks for and in electronic circuit boards and devices utilising such conductive tracks. The invention is particularly concerned with the formation of conductive tracks or electronic circuits of high resolution (i.e. fine tracks) in a manner which reduces problems that may arise in registering two layers of electronic circuitry, and utilises photosensitive materials in the generation of conductive tracks for electronic circuit boards and thin and flexible display applications.

BACKGROUND OF THE INVENTION

In the imaging, lighting, display and electronics industries, it is predicted that in order to meet consumer demands, and fuelled by industry competitiveness, electronics products will be required to be increasingly durable, thin, lightweight and of low cost. In a growing market where consumers are demanding more from portable electronic devices and displays such as mobile phones, laptop computers, etc., flexible displays and electronics have the potential to eliminate the rigid constraints of traditional flat panel displays and electronics products. The goal in displays and electronics is to produce thin, lightweight, flexible devices and displays with achievable power requirements at a minimal cost.

Traditionally electronic devices requiring multiple layers of circuits have been fabricated using multiple circuit boards, with circuitry formed on one or both sides thereof, which may be bonded together and connected to one another by drilling holes (or vias) in the circuit boards which are filled with conductive material. To make such multiple layer circuit boards, a copper coated insulating board made of a composite material is treated with a light-sensitive material, known as a photoresist, which is imaged with the pattern of the desired electronic circuit, typically by exposing the photoresist through a photomask. The resist is affected by the exposure such that the exposed and non-exposed parts can be differentiated in terms of ease or method of removal. The imaged resist is then treated to remove the resist in an image-wise manner to reveal bare copper. The bared copper is then etched away and then the remaining resist removed to reveal a copper track on the insulating board. A second board may be made in a similar way with its own circuit pattern and the two boards bonded together and optionally connected by drilling vias as mentioned above.

The process of making electronic circuit boards such as this can be quite laborious and involves several sequential steps. A problem with making multiple layer circuit boards in this way, especially boards of greater than one meter across, is that it is not always possible to register the boards accurately. The photomasks used to image the photoresist-coated copper-clad boards are often subject to dimensional instability. For example, a mask, which is usually a photographic film, typically exhibits a humidity expansion coefficient of about 0.0012% per percent relative humidity, such that on a 5% change in relative humidity, a one meter photomask will expand or contract by about 60 µm. Polyester film has a thermal expansion coefficient of 0.0018% per ° C., such that a 5° C. change will result in a dimensional change of 90 µm and the effect of humidity expansion and thermal expansion can be cumulative. The conductive track resolution available by this method is therefore severely limited by the dimensional instability of the photomask, in that if it was desired to connect tracks of 50 µm width on one circuit board with that of another circuit board by drilling a via, a possible positional error of greater than 50 µm may hinder connection.

It is desirable to provide a solution to overcome the problem of registration in printed circuit board manufacture, to improve the efficiency of the electronic circuit manufacturing process and to enable electronic circuits to be generated on flexible supports to meet the predicted growth in demand for flexible circuits and flexible and thin devices. A number of attempts to provide new manners of manufacturing electronic circuits have been previously disclosed.

U.S. Pat. No. 4,469,777 relates to a process for preparing a two-layer printed circuit having conductive interconnections, via a singe exposure. According to the process described, at least one layer of a photoadhesive material is laminated onto a substrate bearing an electrically conductive circuit and then exposed to actinic radiation through a photomask of three different optical densities, one that transmits substantially all the radiation, one that transmits substantially no radiation and one that transmits an intermediate amount of radiation. The areas of the coated substrate exposed to substantially no radiation are removed by application of a suitable solvent in which the exposed photoadhesive material is insoluble, to form holes for vias. Finely divided metal, alloy or plating catalyst is applied to the adherent image areas (optionally tackified by heating) which correspond to the areas exposed to light of intermediate optical density and which correspond to a desired circuit patter and to the holes to form interconnecting vias (connecting the circuit pattern on the substrate to the circuit pattern on the surface of the laminated photoadhesive material). The pattern is then plated to generate an electrically conductive circuit pattern interconnected with the underlying pattern. Further layers of circuit may be formed by repeating the process.

U.S. Pat. No. 5,384,230 describes a method of fabricating printed circuit boards whereby the surface of a circuit board is covered with a photoresist layer and the photoresist layer in turn covered with a silver halide emulsion layer. The silver halide emulsion layer is then exposed according to a desired circuit board pattern with white light and the image developed to form a high definition mask in direct contact with the resist. The board is then exposed to UV light through the imaged emulsion layer, which is then stripped and the exposed photoresist-coated board processed in the conventional manner.

U.S. Pat. No. 2,854,386 relates to a method of photographically printing conductive metal patterns. As described therein, a thin layer of a photographic silver halide emulsion coated onto a support is exposed according to a desired pattern through a master transparency to generate a latent image which forms a dense and visible silver image upon development, preferably with a high contrast, non-fogging developer. The visible silver image formed is a negative of the final desired pattern. An oxidising etch solution is then applied which oxidises the metallic silver and simultaneously softens the associated gelatin thereby removing the gelatin from the support to leave a residual gelatin image. A latent silver image is formed in the residual gelatin image by re-exposing the whole support to actinic radiation and the silver nuclei act as seeds in the subsequent physical development step to form a heavy continuous conductive silver deposit. The resulting conductive silver pattern may be plated with copper or other metal according to standard electroplating techniques. In a second described embodiment, the emulsion is of a wash-off type emulsion comprising unhardened gelatin and a light sensitive tanning agent. The emulsion layer is exposed according to the desired pattern and non-pattern areas of gelatin removed by a wash-off developer to form a gelatin image of the desired pattern. A preliminary silver image is formed in the gelatin image by treating it with an alkaline solution and a silver salt, such as silver nitrate, whereby silver oxide particles are formed in the gelatin image, which then form the nuclei for forming a silver deposit via a physical development process and may optionally be electroplated with copper or other metal.

U.S. Pat. No. 2,195,531 describes a coating of nitrocellulose containing a photosensitive compound (silver bromide) and a conductor (carbon) on a cellulose acetate support, which is exposed according to a desired pattern and then developed, fixed and washed. The conductivity of the film depends upon the amount of carbon and the amount of reduced metal compound therein. The developed element may be used as a resistance element or variable resistor.

U.S. Pat. No. 3,223,525 describes a method of manufacturing, by photographic means, external electrically conductive noble-metal patterns on non-conductive supports. In the described method, a non-conductive support is treated with a light-sensitive compound such as silver halide, exposed to light to produce a silver or mercury germ image, which is then treated with a stabilised physical developer for a prolonged period of time whereby the internal image is made to grow out beyond the surface of the support to become an external image having resistivity of less than $10^4$ ohms per square.

U.S. Pat. No. 3,929,483 describes a method by which one-sided and/or two-sided plated through-conductive circuit boards useful for printed circuits may be produced. An anodized aluminium sheet sensitised (on one or both sides) with silver salts is exposed according to a circuit pattern and developed, optionally with a physical developer, to generate a silver image. This is treated with hypochlorite solution and the resulting pattern plated with a metal to form conductive tracks. Where tracks are formed on both sides of the support, they may be connected by drilling through the support using standard techniques or by utilising a pre-drilled support.

DE 198373 relates to the production of conductive strips, resistors, and capacitors by photographic means. It describes a photosensitive material comprising an insulating layer support coated with two photosensitive, fine grain silver chlorobromide emulsion layers having a gelatin/silver ratio of 1:3 and being sensitive to the blue, green or red region of the spectrum (optionally to different regions). The two silver chlorobromide emulsion layers are separated by a dielectric layer, which is permeable to photographic development baths and which preferably has a thickness of between 3 and 4 µm and optionally contains dielectrically active metal oxides such as $TiO_2$, $Al_2O_3$ and $SiO_2$. Exposure of the emulsion layers through a mask according to the desired conductive pattern in each layers followed by development using a photographic developer with a development accelerator leads to formation of respective electrically conductive layers. Connectivity between the upper and lower electrically conductive layers formed from the respective emulsion layers can be effected by applying the intermediate dielectric layer in strips, with the required intermediate spaces.

U.S. Pat. No. 3,647,456 relates to a method of making electrically conductive silver images with the object of providing such electrically conductive silver images having high spatial resolution, which conducting silver image may be advantageously utilised in printed circuit techniques thereby eliminating the need for an aluminium layer in photoresists and establishing a silver pattern directly upon a wafer. There is described the use of a coating of silver bromide emulsion comprising cadmium iodide on a substrate to produce a latent image on the substrate, developing the latent image using a high resolution developer to provide a silver image and heating the silver image at a temperature of from 200° C. to 450° C. to render the silver image electrically conductive.

U.S. Pat. No. 6,517,931 describes a method of using a conductive silver ink in the manufacture of multi-layer ceramic capacitor (MLC) devices. The silver ink described typically comprises at least a high purity silver powder having an average particle size of up to 1 µm; an inhibitor such as a barium titanate based material; and a vehicle comprising a mixture of resin (e.g. ethyl cellulose) and solvent (e.g. toluene/ethanol mixture). According to U.S. Pat. No. 6,517,931, the ink is screen printed to a desired pattern on dielectric green tapes which are stacked to form a registry, laminated under pressure and then fired to form the MLC device.

The various alternative methods of generating printed circuit patterns illustrated in the above-referenced documents each has advantages as described therein, but they do not provide a solution to overcome the problem of registration in printed circuit board manufacture, to improve the efficiency of the electronic circuit manufacturing process, to enable narrow tracks and/or narrow gaps of less than 25 µm and to enable electronic circuits to be generated on flexible supports to meet the predicted growth in demand for flexible circuits and flexible and thin devices.

Problem To Be Solved By The Invention

It is desirable to provide a method of forming conductive tracks in two or more layers which method avoids problems associated with registration of circuit patterns on a multi-layer circuit board.

It is further desirable to provide a method of forming conductive tracks which is more efficient and involves fewer steps in fabrication as compared with traditional printed circuit board manufacture.

It is still further desirable to provide a method capable of forming conductive tracks or conductive areas having gaps with very high resolution to meet the demands of increasingly complex circuitry of high-tech devices.

And it is still further desirable to provide a method of forming two or more layers of conductive tracks on a flexible support to meet the predicted growth in demand for flexible circuits and flexible and thin devices.

SUMMARY OF THE INVENTION

According to a first aspect of the invention, there is provided a photosensitive element comprising a support; a first photosensitive silver halide emulsion layer sensitive to radiation of a first spectral region coated on one side of said support; and a second photosensitive silver halide emulsion layer sensitive to radiation of a second spectral region coated on the other side of said support, whereby upon exposure to radiation of respective first and second spectral regions according to a desired pattern and development of the exposed photosensitive layers said first and second photosensitive layers are capable of being converted to silver conductive layers having a pattern of conductive tracks corresponding to the desired pattern.

In a second aspect of the invention, there is provided a method of manufacturing a multiple layer conductive element, said conductive element having at least two layers of conductive materials, said method comprising the steps of providing a two-sided photosensitive element as defined above, said photosensitive element comprising a support; a first photosensitive silver halide emulsion layer sensitive to radiation of a first spectral region coated on one side of said support; and a second photosensitive silver halide emulsion layer sensitive to radiation of a second spectral region coated on the other side of said support, exposing said first and second photosensitive layers to radiation of respective first and second spectral regions according to respective first and second desired patterns; and developing said exposed photosensitive layers to form conductive silver layers having patterns of conductive tracks corresponding to the desired patterns.

Advantageous Effect Of The Invention

The element and method of the invention enables the formation of conductive tracks in at least two layers, at least one on each side of a flexible support substrate, which allows conductive tracks to be used to form circuits for flexible electronic devices, provides a thin two conductive layer arrangement since only a single support substrate is required and avoids possible difficulties with registration by pre-registering the two layers in which conductive patterns are to be formed. The method also enables this multilayer conductive element to be fabricated more efficiently and in fewer steps than traditional printed circuit board methods, for at least the reason that each processing step may be carried out simultaneously on the two or more layers in which conductive tracks are to be formed.

The method and element of the present invention also has the advantage over prior art conductive track systems that very high resolution track widths and gaps are possible.

DETAILED DESCRIPTION OF THE INVENTION

The present invention is concerned with a method of manufacturing a multiple layer conductive element having at least one conductive layer with a conductive track pattern on each side of a support substrate. The multiple layer conductive element is obtained by imagewise exposing, according to a desired pattern, each of at least one photosensitive silver halide emulsion layer on each side of a support of a photosensitive element, followed by developing the latent images formed to form conductive silver layers providing conductive metal patterns. The at least two photosensitive layers on the photosensitive element according to the invention, referred to as a first photosensitive layer located on one side of the support and a second photosensitive layer located on the other side of the support, are sensitised respectively to a first spectral region and a second spectral region, which first and second spectral regions may be the same, but are preferably different, or at least have a different wavelength of maximum absorption and little overlap.

For convenience, the conductive pattern formed in the layer of the multilayer conductive element corresponding to the first photosensitive layer shall be referred to as the first conductive pattern (and the conductive layer as the first conductive layer) and the conductive pattern formed in the layer of the multilayer conductive element corresponding to the second photosensitive layer shall be referred to as the second conductive pattern (and the conductive layer as the second conductive layer).

The first and second photosensitive layers of the photosensitive element according to the invention are separated by a support substrate. The support substrate should be sufficiently insulating so as to prevent unwanted conductivity between the conductive patterns formed according to the method of the present invention from the first and second photosensitive layers, which could otherwise cause the multiple layer conductive element to short circuit.

Typically it is desirable to form electrical connections in a controlled manner between the conductive patterns on each side of the support. The conductive pattern formed from the first photosensitive layer of the photosensitive element may be connected as desired to the conductive pattern formed from the second photosensitive layer by drilling holes or vias through the multilayer conductive element and filling or coating the vias with a conductive material, such as conductive paints, pastes, inks and glues as are well known in the technical field.

The multiple layer conductive elements according to the present invention may be designed and utilised for a variety of different applications. For example, the elements may be used as electronic circuits in place of conventional printed circuit boards for conventional electronic devices, or as flexible electronic circuits for use in thin or flexible electronic devices.

Any suitable support may be used for the multiple layer conductive elements according to the invention and depending upon the application of the multiple layer conductive element. The support may be transparent or opaque, rigid or flexible, preferably flexible. Suitable supports include, for example, conventional printed circuit board substrate, glass, paper, resin coated paper, polyethyleneterephthalate (PET), polyethylenenaphthalate (PEN) and cellulose triacetate. An Estar® PET support or a cellulose triacetate support is preferable.

As mentioned above, the at least two photosensitive layers are preferably differently sensitised. Where the support is transparent, the photosensitive layers may be exposed from the same side of the element, preferably at the same time.

The photosensitive layers typically comprise a photosensitive silver halide in a binder, which is typically a hydrophilic binder. By necessity, the binder is largely non-conducting, i.e. is sufficiently insulating to prevent short circuits forming between lines in the conductive patterns in a single conductive layer.

The photosensitive silver halide is capable of forming a latent or germ image upon exposure to radiation to which it is sensitised. The latent or germ image should be capable of imagewise forming a conductive metal image upon development. A photosensitive silver halide material such as that described in U.S. Pat. No. 5,589,318 or U.S. Pat. No. 5,512,415 may be utilised.

The hydrophilic binder may be a hydrophilic colloid selected from gelatin or a gelatin derivative, polyvinylpyrrolidone or casein and may contain a polymer. Suitable hydrophilic colloids and vinyl polymers and copolymers are described in Section IX of the Research Disclosure referred to below. Gelatin is the preferred hydrophilic colloid.

The silver halide emulsions utilised in photographic films for use in the graphic arts or in the preparation of printed circuit boards, are considered useful emulsion formulations according to the multiple layer photosensitive element of the present invention.

The emulsions employed in the photographic materials described herein, and the addenda added thereto, the binders, supports, etc., may be as described in Research Disclosure Item 36544, September 1994, published by Kenneth Mason Publications, Emsworth Hants, PO10 7DQ, UK.

Development of the exposed photosensitive layer to form the conductive metal pattern corresponding to the desired pattern may comprise one or more of conventional development, physical development and electrochemical development.

By conventional development, it is meant that the latent or germ image is treated with a developer composition, which may be incorporated in the photosensitive layer, but requires activation (e.g. by heating or changing pH), or may be added as a solution as part of a development process. The developer composition typically comprises a reducing agent capable of reducing the metal salt to the elemental metal, when catalysed by the elemental particles of the latent or germ image under the conditions of the development process.

By physical development or electroless plating, it is meant that the latent image (or the metal image formed by conventional development) is treated with a solution of a metal salt or complex of the same or different metal as that formed by conventional development of the latent image. Typically the physical development composition will further comprise a reducing agent to enable the physical development composition to be applied directly to the latent image.

By electrochemical development or electroplating, it is meant that a conductive metal image formed by conventional development and/or physical development has a voltage applied across it in the presence of a plating solution comprising a salt or complex of a plating metal, which may be the same or different from that of the metal image to be plated, whereby the conductive metal image is made more conductive. Suitable metals for use in electroplating include, for example, copper, lead, nickel, chromium, gold, and silver, preferably copper or silver and more preferably silver.

In the method of the invention, the exposed photosensitive element may be developed by applying a conventional development step and/or a physical development step and, optionally, an electrochemical development step. Where the development of the exposed photosensitive element comprises a conventional development step and an electrochemical development step (i.e. direct electroplating of a developed image), it is necessary that the image formed by conventional development is sufficiently conductive when a voltage is applied across it. In this case, it is preferable to use the electroplating technique described in our copending UK application No. 0508188.0 of even date entitled, "Method of Forming Conductive Tracks" (Fyson et al.).

The photosensitive element may also contain an overcoat hydrophilic colloid layer on each side, which may also contain a vinyl polymer or copolymer located as the last layer of the coating (furthest from the support). It typically contains one or more surfactants to aid coatability and may also contain some form of matting agent. The vinyl polymer is preferably an acrylic polymer and preferably contains units derived from one or more alkyl or substituted alkyl acrylates or methacrylates, alkyl or substituted acrylamides, or acrylates or acrylamides containing a sulfonic acid group.

The photosensitive element described herein preferably includes an antihalation underlayer that may be on either side of the support, which may be on one or both sides of the support. In a preferred embodiment, an antihalation dye is contained in a hydrophilic colloid underlayer. Suitable antihalation dyes are listed in the Research Disclosure referred to above.

The silver halide emulsions of the photosensitive layers may be prepared by any suitable method of grain growth, preferably using a balanced double run of silver nitrate and salt solutions using a feedback system designed to maintain the silver ion concentration in the growth reactor. Dopants may be introduced uniformly from start to finish of precipitation or may be structured into regions or bands within the silver halide grains. The dopants, for example, osmium dopants, ruthenium dopants, iron dopants, rhenium dopants and/or iridium dopants, for example cyanoruthenate dopants, may be added. Such complexes may alternatively be utilised as grain surface modifiers in the manner described in U.S. Pat. No. 5,385,817. Chemical sensitisation may be carried out by any of the known methods, for example with thiosulfate or other labile sulfur compound, and with gold complexes. Preferably, the chemical sensitisation is carried out with thiosulfate and gold complexes.

After addition of the sensitising dye at a level to give the emulsion the desired sensitivity for the particular photosensitive layer, antifoggants and stabilisers may be added as is known in the art. Antifoggants that may be useful in silver halide emulsions according to the present invention include, for example, azaindenes such as tetraazaindenes, tetrazoles, benzotriazoles, imidazoles and benzimidazoles. Specific antifoggants that may be used include 5-carboxy-2-methylthio-4-hydroxy-6-methyl-1,3,3a,7-tetraazaindene, 1-(3-acetamidophenyl)-5-mercaptotetrazole, 6-nitrobenzimidazole, 2-methylbenzimidazole and benzotriazole.

Development boosters may be used. Booster compounds that may be present in the photographic material (or alternatively, in the developer solution used) include amine boosters that comprise at least one secondary or tertiary amino group and have an n-octanol/water partition coefficient (log P) of at least 1, preferably at least 3. Suitable amine boosters include those described in U.S. Pat. No. 5,512,415, col. 7, line 27 to col. 8, line 16, the disclosure of which is incorporated herein by reference. Preferred boosters are bis-tertiary amines and bis-secondary amines, preferably comprising dipropylamino groups linked by a chain of hydroxypropyl units, such as those described in U.S. Pat. No. 6,573,021.

The photosensitive silver halide contained in the photosensitive layers may be processed (according to a conventional development procedure) following exposure to form a visible image by associating the silver halide with an aqueous alkaline medium in the presence of a developing agent contained in the medium or in the material itself. The exposed photosensitive element may be processed in conventional developers to obtain very high contrast images. When the material contains an incorporated developing agent, it can be processed in the presence of an activator, which may be identical to the developer in composition, but lacking a developing agent.

The developers are typically aqueous solutions, although organic solvents, such as diethylene glycol, can also be included to facilitate the solution of organic components. The developers contain one or a combination of conventional developing agents, such as for example, a polyhydroxybenzene such as dihydroxybenzene, aminophenol, a paraphenylenediamine, ascorbic acid, erythorbic acid and derivatives thereof, pyrazolidone, pyrazolone, pyrimidine, dithionite and hydroxylamine.

It is preferred to employ hydroquinone and 3-pyrazolidone developing agents in combination or an ascorbic acid-based system. An auxiliary developing agent exhibiting super-additive properties may also be used. The pH of the developers can be adjusted with alkali metal hydroxides and carbonates, borax and other basic salts.

To reduce gelatin swelling during development, compounds such as sodium sulfate can be incorporated into the developer. Chelating and sequestering agents, such as ethylenediamine tetraacetic acid or its sodium salt, can be present. Generally any conventional developer can be used in the practice of this invention. Specific illustrative photographic developers are disclosed in the Handbook of Chemistry and Physics, $36^{th}$ Edition, under the title "Photographic Formulae" at page 30001 et seq. and in "Processing Chemicals and Formulas", $6^{th}$ Edition, published by Eastman Kodak Company (1963).

With regard to high contrast silver halide emulsions suitable for use in manufacturing printed circuit boards or for use in backplane electronics of display devices, for example, to which the present invention is particularly applicable, the silver halide emulsion is preferably a chlorobromide emulsion. Preferably, the silver halide emulsion comprises at least 40 mol % silver chloride, more preferably 50-90 mol % silver chloride and most preferably 50-80 mol % silver chloride. The remainder of the silver halide is preferably substantially made up of silver bromide and more preferably comprises a small proportion (e.g. up to 1 or 2%) of silver iodide.

Where the photosensitive layers comprise an emulsion of silver halide in gelatin, the weight ratio of silver to gelatin is preferably at least 2 to 1.

Where a transparent support is utilised, the two photosensitive layers are preferably sensitised in a complementary manner whereby the first photosensitive layer is not sensitive to the wavelength of light used to expose the second photosensitive layer with its desired pattern, and vice versa.

For example, the first photosensitive layer may be sensitised to red light and the second photosensitive layer sensitised to green light. Alternative sensitisation arrangements to achieve the same effect are contemplated.

In such an element, where a transparent support is utilised, having one photosensitive layer on each side of the support, a filter layer may be incorporated between the two photosensitive layer to improve the separation of photosensitivity.

The conductive patterns formed by exposure and development of the photosensitive layers of the photosensitive element according to the invention preferably have a conductivity (expressed as resistivity) of 200 ohms/square or less, being achievable with the preferred silver halide emulsions and a conventional development step, more preferably 50 ohms/square or less, still more 10 ohms/square or less. By exposing a photosensitive layer of the type used in the element of the invention to a desired pattern, and processing the exposed layer with a conventional development step and a physical development step, tracks having a conductivity of 10 ohms/square may be formed, optionally as much as 0.2 ohms/square. By further adopting a electrochemical development (electroplating) step, conductivity of up to about 10 milliohms/square is achievable.

Another advantage of the method of the invention is the resolution of lines and gaps that is achievable. Effective conductive patterns may have a line width of, for example, 50 μm or less, optionally 20 μm or less or 10 μm or less. Preferably, for some applications conductive patterns having line widths in the range 1 to 8 μm may be formed. Typically, a minimum line width is necessary (e.g. at least 0.5 μm) in order to enable continuous conductivity throughout the conductive pattern. Similar resolutions (and preferred resolutions) apply to the gap widths that are achievable according to the method of the invention. For example, it is considered that a gap width of 10 μm or less is achievable.

Any suitable method of spectral sensitisation may be used as are common in photographic silver halide emulsions. Suitable such methods of spectral sensitisation are described, for example, in Research Disclosure, Item 37038, February 1995, Sections I to V.

Spectral sensitisation to provide differently sensitised photosensitive emulsions of silver halide, or layers thereof, can be carried out by any suitable method suitable for use in the photographic arts.

The patents and publications referred to herein are incorporated by reference in their entirety.

The invention will now be described with reference to the following examples, which are not however to be construed as limiting the scope thereof.

EXAMPLES

Example 1

A photographic film was prepared which comprised a transparent support of Estar™ polyethyleneterephthalate having coated on one side thereof a red-sensitive photographic emulsion layer and an antihalation layer acting as a protective topcoat and, on the other side, a yellow filter layer, a blue-sensitive photographic emulsion layer and a protective topcoat. Each of the layers employed in the photographic film were prepared as described below.

The Antihalation Layer Acting as a Protective Topcoat

A solution was prepared by dissolving 108.3 g of lime-processed ossein gelatin, after soaking, in 1942 g of water at 49° C. The solution was treated with 684 g of a 4.7% aqueous solution of acidified hydroquinone, followed by 134 g of a dispersion, in gelatin, of a poly dimethylsiloxane available from Dow Chemical Company under the trade name DC-200™ [CAS No 63148-62-9] in an amount to provide a coverage of 45 mg/m². 220 g of a 20% aqueous solution of tiron [CAS No 149-45-1] was added, followed by 240 g of a 10% aqueous solution of a booster (contrast promoting agent) having the formula:

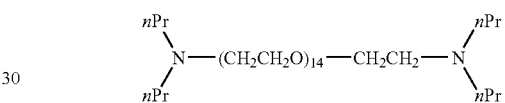

To this formulation was added 437 g of a 10% aqueous slurry of a triethylamine salt of 4-(5-(5-(1-(4-carboxyphenyl) hexahydro-2,4,6-trioxo-5-pyrimidinyl)-2,4-pentadienylidene)tetrahydro-2,4,6-trioxo-1(2H)-pyrimidinyl) benzoic acid, which has the formula:

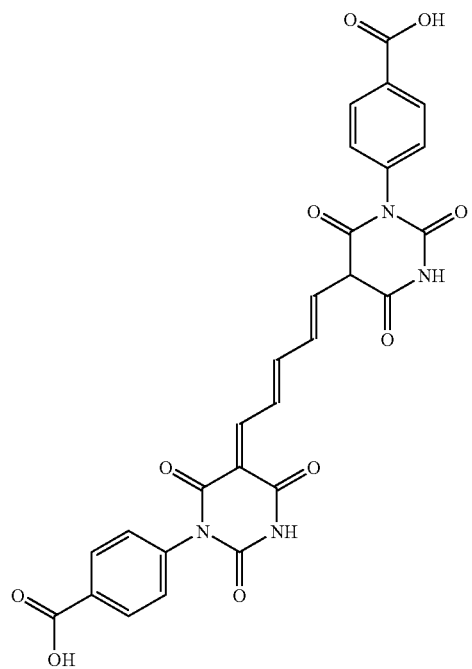

[CAS No. 115311-00-7]

such that the dye would have a coverage of 110 mg/m$^2$, followed by a small amount of surfactant and polystyrene sulfonic acid to aid coating. The pH was adjusted to 5.1. The gelatin laydown for this layer was 0.3 g/m$^2$.

Red-Sensitive Layer

A high contrast emulsion was used which consisted of a sulfur- and gold-sensitised 0.18 μm cubic silver bromochloride (AgBr$_{0.3}$Cl$_{0.7}$) in a binder system. The silver halide was sensitised to red light using potassium iodide and a sensitising dye: 5-[3-(carboxymethyl)-5-[2-methyl-1-[(3-methyl-2 (3H)-benzothiazolylidene)methyl]propylidene]-4-oxo-2-thiazolidinylidene]-4-oxo-2-thioxo-3-thiazolidineacetic acid [CAS No 253869-55-5] having the formula:

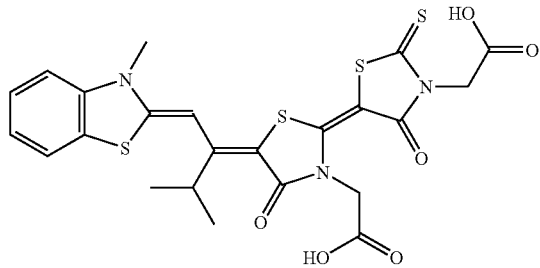

The equivalent silver laydown was 3.2 g/m$^2$. The binder system consisted of lime-processed ossein gelatin at 1.6 g/m$^2$. The emulsion was protected against fogging by use of a tetraazaindene: 7-hydroxy-5-methyl-2-(methylthio)-(1,2,4) triazolo(1,5-a) pyrimidine-6-carboxylic acid, a phenyhnercaptotetrazole: N-(3-(2,5-dihydro-5-thioxo-1H-tetrazol-1-yl)phenyl)-acetamide and 2,3-dihydro-2-thioxo-4-thiazoleacetic acid. The viscosity was adjusted to ~6 cP by use of polystyrene sulfonic acid at a pH of 5.1.

The red-sensitive layer and the antihalation layer acting as a protective topcoat were co-coated onto the transparent support.

Yellow Filter Layer

A solution was prepared by dissolving 99 g of lime-processed ossein gelatin, after soaking, in 3354 g of water at 49° C. The solution was treated with 328 g of a 30% solution of a blend of latex copolymer of methyl acrylate, the sodium salt of 2-acrylamido-2-methylpropane sulfonic acid and 2-(methacryloyloxy)ethylacetoacetate (88:5:7 by weight), followed by 99 g of a 20% slurry of a solid particle dye, N-(4-(4-cyano-2-(2-furanylmethylene)-2,5-dihydro-5-oxo-3-furanyl)phenyl)-1-butanesulfonamide [CAS Number 130016-98-7], having the formula:

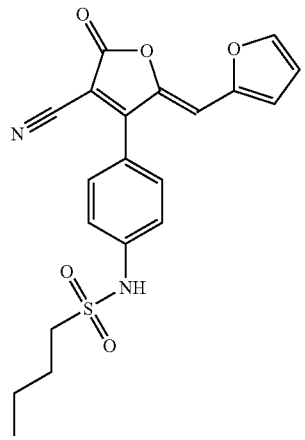

The formulation was then treated with a small amount of surfactant and polystyrene sulfonic acid to aid coating. The pH was adjusted to 5.1. The gelatin laydown for this layer was 1 g/m$^2$. The laydown of the latex copolymer was 1 g/m$^2$. The laydown of the dye was 200 mg/m$^2$.

Blue-Sensitive Layer

A high contrast emulsion was used, which consisted of a sulfur- and gold-sensitised 0.18 μm cubic silver bromochloride (AgBr$_{0.3}$Cl$_{0.7}$) in a binder system.

The equivalent silver laydown was 3.6 g/m$^2$. The binder system consisted of lime-processed ossein gelatin at 1.6 g/m$^2$. The emulsion was protected against fogging by use of a tetraazaindene: 7-hydroxy-5-methyl-2-(methylthio)-(1,2,4) triazolo(1,5-a) pyrimidine-6-carboxylic acid, a phenylmercaptotetrazole: N-(3-(2,5-dihydro-5-thioxo-1H-tetrazol-1-yl)phenyl)-acetamide and 2,3-dihydro-2-thioxo-4-thiazoleacetic acid. The viscosity was adjusted by use of polystyrene sulfonic acid at a pH of 5.1

Protective Topcoat:

A solution was prepared by dissolving 108 g of lime-processed ossein gelatin, after soaking, in 2280 g of water at 49° C. The solution was treated with 684 g of a 4.7% aqueous solution of acidified hydroquinone, followed by 134 g of a dispersion, in gelatin, of a polydimethyl siloxane available from Dow Chemical Company under the trade name DC-200™ [CAS No 63148-62-9] in gelatin in an amount to provide a coverage of 45 mg/m$^2$. 220 g of a 20% aqueous solution of Tiron™ [CAS No 149-45-1] was added, followed by 240 g of a 10% aqueous solution of a booster (contrast promoting agent) having the formula:

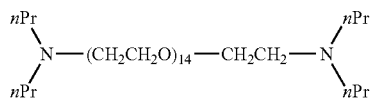

The formulation was treated with a small amount of surfactant and polystyrene sulfonic acid to aid coating. The pH was adjusted to 5.1. The gelatin laydown for this layer was 0.3 g/m$^2$.

The yellow filter layer, blue-sensitive emulsion layer, and protective topcoat were co-coated onto the previously prepared substrate containing the red-sensitive layer.

The film was then exposed via a contact frame first with an image of a circuit through a Wratten™ 47B filter, and then with a complementary image of another circuit through a Wratten™ 29 filter. Part of the pattern exposed on each side consisted of a bar 41 mm long by 1 mm wide.

The film was developed in a tanning developer, which consisted of Solution A and Solution B, the compositions of which are set out below, which solutions were mixed in a 1:1 ratio (i.e. 100 ml Solution A plus 100 ml Solution B) just prior to use.

| Solution A | |
|---|---|
| Pyrogallol | 10 g |
| Sodium sulfite | 0.5 g |
| Potassium bromide | 0.5 g |
| Water to | 500 ml |
| Solution B | |
| Potassium carbonate | 50 g |
| Water to | 500 ml |

Development was continued for approximately 7 minutes at room temperature (21° C.). The oxidation products from the development hardened the gelatin in the exposed areas.

The film was then given a 'hot fix'. The film was immersed in Kodak® RA 3000 fix solution at 40° C. for 10 minutes. By this means the gelatin in the unexposed region becomes soft and either melts, dissolves or simply delaminates leaving only the exposed silver as a relief image. The 'hot fix' is more efficient than simply washing with cold and then warm water and also rids the photographic image of a few residual undeveloped silver halide grains. These grains would otherwise become silver in the subsequent plating bath and limit the resolution of the final pattern.

The film was then rinsed in cold water for 5 minutes and then dried.

The film was then immersed in an electroless silver plating bath at room temperature for 30 minutes. The composition of the bath, comprising two parts mixed just prior to use, was as follows:

| Part A | |
|---|---|
| ferric nitrate nonahydrate | 40 g |
| citric acid | 10.5 g |
| water to | 250 g |
| warm to >25 C. | |
| ammonium ferrous sulfate•12H$_2$O | 39.2 g |
| water to | 367.5 g |
| DDA** 10% | 2.5 g |
| Lissapol 1 ml in 100 ml | 2.5 g |
| Part B | |
| silver nitrate | 5 g |
| water to | 125 g |

Parts A and B were Mixed Just Prior to Use

The resultant metallic silver pattern corresponded to the exposed pattern and part of which pattern on each side consisted of a bar 41 mm long, by 1 mm wide. The resistance of this bar, on each side, was measured as 11.5 ohms. This is equivalent to a value of under 0.3 ohms/sq.

A simple device with lights was then prepared.

The circuits could be connected together by drilling a hole in the support to form a via and the via filled with a conductive paste (RS sourced two part conductive epoxy). A battery, and LED lights were then glued to the circuit patterns on each side along with a resistor using conductive paste. The resistor was necessary as the conductivity of the tracks was too high for the LED lights utilised.

A test pattern of a hundred and twenty five 40 µm lines with 40 µm gaps each 1 cm long was imaged along with the simple circuit pattern. The resistance of the tracks was 64 ohms, equivalent to 0.26 ohms/sq. This demonstrates that this technique is capable of generating conductive circuits with resolution less than 50 µm.

Example 2

The same film as used in Example 1 was used but in this case the electroless plating step was only 10 minutes, to produce a less conductive circuit. A test pattern of a hundred and twenty five 40 µm lines with 40 µm gaps each 1 cm long was imaged along with the simple circuit pattern. The resistance of the tracks was 500 ohms, equivalent to 2 ohms/sq. This demonstrates that this technique is capable of generating conductive circuits with resolution less than 50 µm. The circuit can act as its own resistor.

Example 3

A photographic film was prepared which comprised a transparent support of Estar® having coated on one side thereof a red-sensitive photographic emulsion layer and an antihalation layer acting as a protective topcoat and, on the other side, a green-sensitive photographic emulsion layer and a protective topcoat.

The Antihalation Layer Acting as a Protective Topcoat

A solution was prepared by dissolving 108.3 g of lime-processed ossein gelatin, after soaking, in 1651 g of water at 49° C. The solution was treated with 685 g of a 4.7% aqueous solution of acidified hydroquinone, followed by 134 g of a dispersion, in gelatin, of a polydimethyl siloxane available from Dow Chemical Company under the trade name of DC-200™ [CAS No 63148-62-9] in an amount to provide a coverage of 45 mg/m$^2$. 220 g of a 20% aqueous solution of Tiron™ [CAS No 149-45-1] was added, followed by 240 g of a 10% aqueous solution of a booster (contrast promoting agent) having the formula:

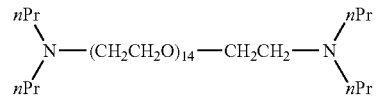

The formulation was treated with 437 g of a 10% aqueous slurry of triethylamine salt of 4-(5-(5-(1-(4-carboxyphenyl) hexahydro-2,4,6-trioxo-5-pyrimidinyl)-2,4-pentadi-enylidene)tetrahydro-2,4,6-trioxo-1(2H)-pyrimidinyl) benzoic acid dye [CAS No. 115311-00-7] such that the dye would have a coverage of 110 mg/m$^2$, followed by a small amount of surfactant and polystyrene sulfonic acid to aid coating. The pH was adjusted to 5.1. The gelatin laydown for this layer was 0.3 g/m$^2$.

Red-Sensitive Layer

A high contrast emulsion was used, which consisted of a sulfur- and gold-sensitised 0.18 µm cubic silver bromochloride (AgBr$_{0.3}$Cl$_{0.7}$) in a binder system. The silver halide was sensitised to red light using potassium iodide and a sensitising dye: 5-[3-(carboxymethyl)-5-[2-methyl-1-[(3-methyl-2 (3H)-benzothiazolylidene)methyl]propylidene]-4-oxo-2-thiazolidinylidene]-4-oxo-2-thioxo-3-thiazolidineacetic acid [CAS No 253869-55-5] having the formula:

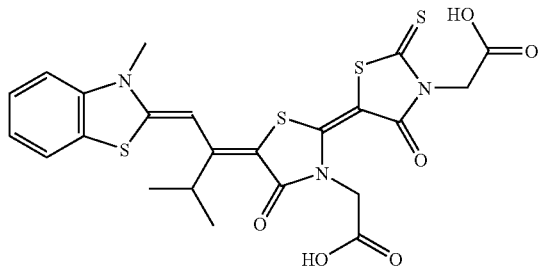

The equivalent silver laydown was 3.2 g/m$^2$. The binder system consisted of lime-processed ossein gelatin at 1.6 g/m$^2$. The emulsion was protected against fogging by use of a tetraazaindene: 7-hydroxy-5-methyl-2-(methylthio)-(1,2,4) triazolo(1,5-a) pyrimidine-6-carboxylic acid, a phenylmercaptotetrazole: N-(3-(2,5-dihydro-5-thioxo-1H-tetrazol-1-yl)phenyl)acetamide and 2,3-dihydro-2-thioxo-4- thiazoleacetic acid. The viscosity was adjusted to ~6 cP by use of polystyrene sulfonic acid at a pH of 5.1

The red-sensitive layer and the antihalation layer acting as a protective topcoat were co-coated onto the support.

Green-Sensitive Layer

A high contrast emulsion was used, which consisted of a sulfu- and gold—sensitised 0.18 μm cubic silver bromochloride ($AgBr_{0.3}Cl_{0.7}$) in a binder system. The silver halide was sensitised to green light ($\lambda_{max}$ of approximately 500 nm) using potassium iodide and a sensitising dye: 5-chloro-2-(3-(1,3-dihydro-1-methyl-3 (3-sulfobutyl)-5-(trifluoromethyl)-2H-benzimidazol-2-ylidene)-1-propenyl)-3-ethyl-1-(2-hydroxyethyl)-6-trifluoromethyl)-1H-benzimidazolium hydroxide, inner salt.

The silver laydown was 3.6 g/m². The binder system consisted of lime-processed ossein gelatin at 1.6 g/m². The emulsion was protected against fogging by use of a tetraazaindene: 7-hydroxy-5-methyl-2-(methylthio)-(1,2,4)triazolo(1,5-a) pyrimidine-6-carboxylic acid and a phenylmercaptotetrazole: N-(3-(2,5-dihydro-5-thioxo-1H-tetrazol-1-yl)phenyl)-acetamide. A contrast-promoting substituted phenylpolyethylene oxide based surfactant, Brij 98, was added as a 4.2% solution, such that the coverage was 335 mg/m². A 30% solution of a blend of latex copolymer of methyl acrylate, the sodium salt of 2-acrylamido-2-methylpropanesulfonic acid and 2-(methacryloyloxy)ethylacetoacetate (88:5:7 by weight), was added such the coverage of the polymer was 1.5 g/m². The viscosity was adjusted by use of polystyrene sulfonic acid at a pH of 5.1

Green-Sensitive Emulsion Topcoat:

A solution was prepared by dissolving 108 g of lime-processed ossein gelatin, after soaking, in 2280 g of water at 49° C. The solution was treated with 684 g of a 4.7% aqueous solution of acidified hydroquinone, followed by 134 g of a dispersion, in gelatin, of a poly dimethylsiloxane available from Dow Chemical Company under the trade name DC-200™ [CAS No 63148-62-9] in an amount to provide a coverage of 45 mg/m². 220 g of a 20% aqueous solution of Tiron™ [CAS No 149-45-1] was added, followed by 240 g of a 10% aqueous solution of a booster (contrast-promoting agent) having the formula:

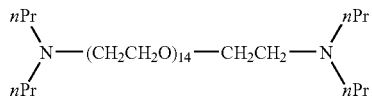

The formulation was then treated with a small amount of surfactant and polystyrene sulfonic acid to aid coating. The pH was adjusted to 5.1. The gelatin laydown for this layer was 0.3 g/m².

The green-sensitive emulsion layer and protective topcoat were co-coated onto the previously prepared substrate containing the red-sensitive layer.

The film was then exposed with light of the appropriate wavelength such that an image of fine lines was produced on both sides of the film.

The film was developed in a tanning developer as for Example 1. The film was then rinsed in cold water for 5 minutes, then dried.

The film was then immersed in an electroless silver plating bath at room temperature for 30 minutes.

The composition of the bath was as follows:

| Part A | |
|---|---|
| ferric nitrate nonahydrate | 40 g |
| citric acid | 10.5 g |
| water to | 250 g |
| warm to >25 C. | |
| ammonium ferrous sulfate•12H$_2$O | 39.2 g |
| water to | 367.5 g |
| DDA** 10% | 2.5 g |
| Lissapol 1 ml in 100 ml | 2.5 g |
| Part B | |
| silver nitrate | 5 g |
| water to | 125 g |

Parts A and B were Mixed Just Prior to Use

Part of the pattern on each side consisted of a bar 41 mm long, by 1 mm wide. The resistance of this bar, on each side, was 11.5 ohms. This corresponds to a value of under 0.3 ohms/sq.

A simple device with lights was then prepared.

The circuits could be connected together by drilling, the via filled with conductive paste. A battery and LED lights were then glued to the circuit patterns on each side along with a resistor with conductive paste. The resistor was necessary as the conductivity of the tracks was too high for the LED lights.

A test pattern of 125,40 μm lines with 40 μm gaps each 1 cm long was imaged along with the simple circuit pattern. The resistance of the tracks was 64 ohms, 0.26 ohms/sq. This demonstrates that this technique is capable of generating conductive circuits with resolution less than 50 μm.

The invention claimed is:

1. A photosensitive element comprising a support; a first photosensitive silver halide emulsion layer sensitive to radiation of a first spectral region coated on one side of said support; and a second photosensitive silver halide emulsion layer sensitive to radiation of a second spectral region coated on the other side of said support, whereby upon exposure to radiation of respective first and second spectral regions according to a desired pattern and development of the exposed photosensitive layers said first and second photosensitive layers are capable of being converted to silver conductive layers having a pattern of conductive tracks corresponding to said desired pattern.

2. The photosensitive element of claim 1, wherein said first spectral region is different from said second spectral region.

3. The photosensitive element of claim 1, wherein said first and second photosensitive layers comprise photosensitive silver halide in a polymer material, whereby exposure and development according to said desired pattern forms conductive silver tracks according to said desired pattern.

4. The photosensitive element of claim 3, wherein said polymer material is gelatin and the silver to gelatin weight ratio is at least 2 to 1.

5. The photosensitive element of claim 1 wherein said support is transparent.

6. A method of manufacturing a multiple layer conductive element, said conductive element having at least two layers of conductive materials, said method comprising the steps of providing a two-sided photosensitive element as defined in claim 1, said photosensitive element comprising
    a support; and
    a first photosensitive silver halide emulsion layer sensitive to radiation of a first spectral region coated on one side of said support; and a second photosensitive silver halide emulsion layer sensitive to radiation of a second spectral region coated on the other side of said support, exposing said first and second photosensitive layers to radiation of respective first and second spectral regions according to respective first and second desired patterns; and developing said exposed photosensitive layers to form conductive silver layers having patterns of conductive tracks corresponding to said desired patterns.

7. The method of claim 6, wherein said first spectral region is different from said second spectral region.

8. The method of claim 6, wherein said first and second photosensitive layers comprise photosensitive silver halide in a polymer material, whereby exposure and development according to said desired pattern forms conductive silver tracks according to said desired pattern.

9. The method of claim 6, wherein said support is transparent and said layers are exposed from the same side of said element.

10. The method of claim 9, wherein said layers are exposed at the same time.

* * * * *